(12) United States Patent
Huang

(10) Patent No.: US 7,217,591 B2
(45) Date of Patent: May 15, 2007

(54) METHOD AND PROCESS INTERMEDIATE FOR ELECTROSTATIC DISCHARGE PROTECTION IN FLAT PANEL IMAGING DETECTORS

(75) Inventor: Zhong Shou Huang, San Jose, CA (US)

(73) Assignee: PerkinElmer, Inc., Santa Clara, CA (US)

( * ) Notice: Subject to any disclaimer, the term of this patent is extended or adjusted under 35 U.S.C. 154(b) by 423 days.

(21) Appl. No.: 10/859,678

(22) Filed: Jun. 2, 2004

(65) Prior Publication Data

US 2005/0272240 A1    Dec. 8, 2005

(51) Int. Cl.
*H01L 29/221* (2006.01)

(52) U.S. Cl. .................. 438/96; 257/E31.062
(58) Field of Classification Search .......... 438/57, 438/96; 257/E31.062
See application file for complete search history.

(56) References Cited

U.S. PATENT DOCUMENTS

| | | | |
|---|---|---|---|
| 4,803,536 A | 2/1989 | Tuan | |
| 5,184,235 A | 2/1993 | Sukegawa | |
| 5,220,443 A | 6/1993 | Noguchi | |
| 5,313,319 A | 5/1994 | Salisbury | |
| 5,353,142 A | 10/1994 | Dodd | |
| 5,471,329 A | 11/1995 | Nakajima | |
| 6,013,923 A * | 1/2000 | Huang | 257/59 |
| 2006/0092591 A1* | 5/2006 | Yuan et al. | 361/91.1 |

* cited by examiner

*Primary Examiner*—Bradley K. Smith
(74) *Attorney, Agent, or Firm*—Felix L. Fischer

(57) ABSTRACT

Shorting bars are provided for electrostatic discharge protection as a portion of trace deposition in a photodiode array. During normal processing for etching of the metal layers, the shorting bars are removed without additional processing requirements. Additional shorting elements are provided by employing FET silicon layers having traces in contact with the array traces to provide extended ESD protection until removal of those shorting elements during normal processing for opening vias for photodiode bottom contact.

7 Claims, 4 Drawing Sheets

METHOD AND PROCESS INTERMEDIATE FOR ELECTROSTATIC DISCHARGE PROTECTION IN FLAT PANEL IMAGING DETECTORS

BACKGROUND OF THE INVENTION

1. Field of the Invention

This invention relates generally to the field of fabrication processing of flat panel imaging detectors and more particularly to the use of one or more shorting elements employing conductive materials in the underlying process for electrostatic discharge protection between components, the shorting elements removed during standard forming processes for the detector.

2. Description of the Related Art

Photosensitive element arrays for converting incident radiant energy into an electrical signal are commonly used in imaging applications, for example, in x-ray imagers and facsimile device arrays. Hydrogenated amorphous silicon (a-Si:H) and alloys of a-Si are commonly used in the fabrication of photosensitive elements for such arrays due to the advantageous characteristics of a-Si and the relative ease of fabrication. In particular, photosensitive elements, such as photodiodes, can be formed from such materials in conjunction with necessary control or switching elements, such as thin film transistors (TFTs), in relatively large arrays.

X-ray imagers, for example, are formed on a substantially flat substrate, typically glass. The imager includes an array of pixels with light-sensitive imaging elements, typically photodiodes, each of which has an associated switching element, such as a TFT or one or more additional addressing diodes. In conjunction with a scintillator, x-rays are transformed into visible light for imaging with the photosensitive elements. The photosensitive elements, typically photodiodes, are connected at one surface to a switching device, typically a TFT, and at the other surface to a common electrode which contacts all the photodiodes in parallel. The array is addressed by a plurality of row and column address lines having contact pads located along the sides of the array. In operation, the voltage on the row lines, and hence the TFTs, are switched on in turn, allowing the charge on that scanned line's photodiodes to be read out via the column address lines, which are connected to external amplifiers. The row address lines are commonly referred to as "scan lines" and the column address lines are referred to as "data lines." The address lines are electrically contiguous with contact fingers which extend from the active region toward the edges of the substrate, where they are in turn electrically connected to contact pads. Connection to external scan line drive and data line read out circuitry is made via the contact pads.

As with most microcircuit devices, the elements of these arrays are subject to damage by electrostatic discharge (ESD). This is particularly true where the relative size, length and separation of traces may result in smaller relative capacitance values. To provide protection from ESD, prior art circuits have employed sacrificial capacitors to absorb ESD energy and therefore protect the image array from damage. But damaged capacitors generate a hard short between traces that needs to be completely removed by laser repair or an additional process step. Some of the known prior art devices use a TFT as an ESD protection device. The gate of the TFT is connected to drain electrode, so large static voltage will turn on the transistor and leak the static charge away before causing any damage. The on-resistance of the TFT is normally larger than 500 KΩ, for an average line capacitance such as 50 pf, 100 ns is needed to completely discharge the static charge. ESD damage such as oxide and nitride breakdown can occur within 10 ns. Therefore, TFT type ESD protection devices are only effective for relatively slow charge building up.

The most effective ESD protection method in the prior art is simply to connect all metal traces together to the ground, so there would not be any bias voltage build-up between them. Metal traces are later separated by using laser or mechanical glass scriber to allow panel testing or assembly. However, laser cutting inevitably generates conductive debris or particles. Mechanical scribing through metal traces will itself introduce ESD risk during scribing. It is also possible to separate metal traces from ground by using wet or dry etching processes. But that requires an additional process step.

It is therefore desirable to provide ESD protection for microcircuit elements during processing wherein the protection device is eliminated during processing without additional processing steps. It is further desirable that no debris or other contaminates from the protection device be present to contaminate processes elements or impart residual features on the final product which could impact performance.

SUMMARY OF THE INVENTION

The present invention constitutes a method for providing electrostatic discharge protection during fabrication processing of photodiode array panels. A first metal layer having first trace and pad features is deposited on a glass substrate. The first metal layer is etched to define the trace and pad contours and a dielectric layer is deposited over the first metal layer. The dielectric layer is etched to provides first vias through the dielectric layer and a second metal layer is deposited contacting the first metal layer through the first vias providing a shorting bar for contact between the traces during further handling and processing for ESD protection. A second dielectric layer is then deposited and a second via surrounding the shorting bar is created during normal processing for connection of a third metal layer to the second metal layer. The third metal layer is deposited and masked for etching. The photoresist around the shorting bar is removed and wet etching of the third metal layer removes the shorting bar allowing normal operation of the array.

In an alternative embodiment, additional ESD protection is provided by leakage paths created through undoped layers of FET silicon as well as metal shorting bars. Etching of the metal shorting bars leaves the FET silicon bars as leakage paths for continued ESD protection until etching for photodiode bottom contact during which the FET silicon shorting bars are simultaneously removed.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1:
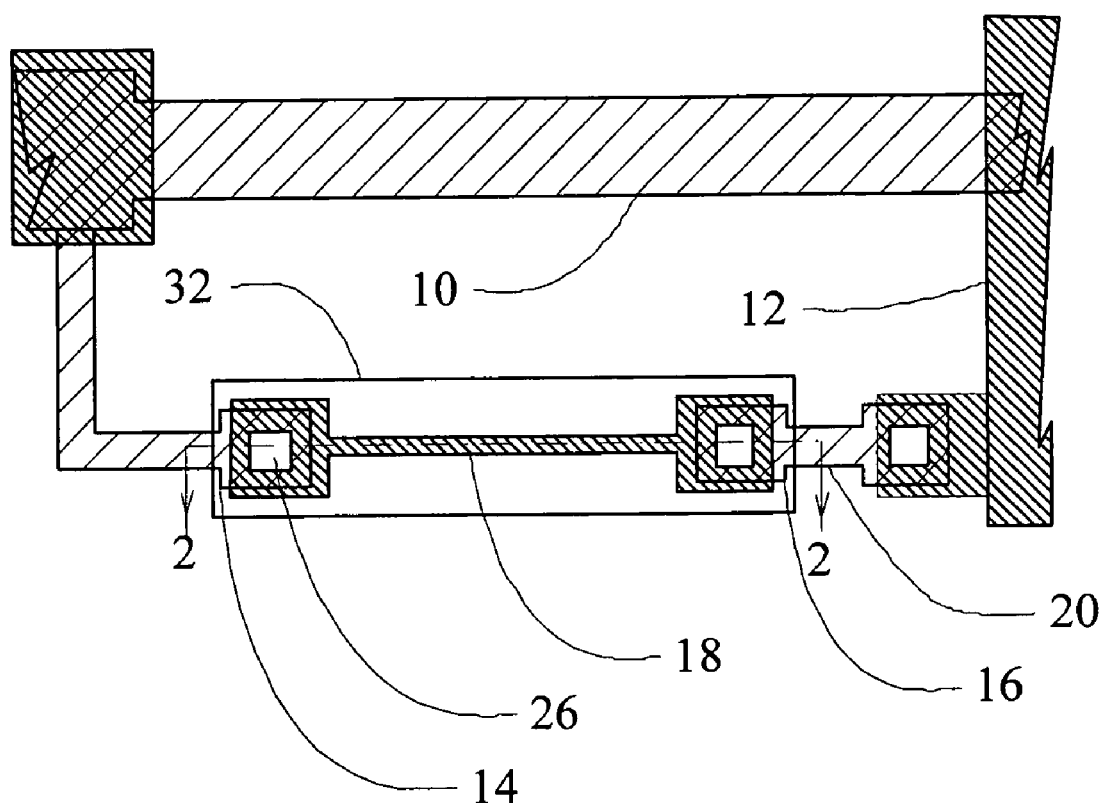
FIG. 1 is a top view of exemplary traces and circuit features of an imager array with a first embodiment of the present invention.

Referring to the drawings, FIG. 1 shows trace 10, a scan line for the embodiment shown and trace 12, a ground line for the embodiment shown, which are representative of the traces for the array as created during the various deposition processes as described subsequently. For the embodiment shown, supplemental pad features 14 and 16 extend from the first and second trace, respectively, for interconnection by a shorting bar 18. In alternative embodiments, the features employed for shorting bar connection are not specific to that purpose but are existing features which have a continuing purpose after removal of the shorting bar as described subsequently. The shorting bar is deposited during normal processing for forming the traces.

Figure 2A:
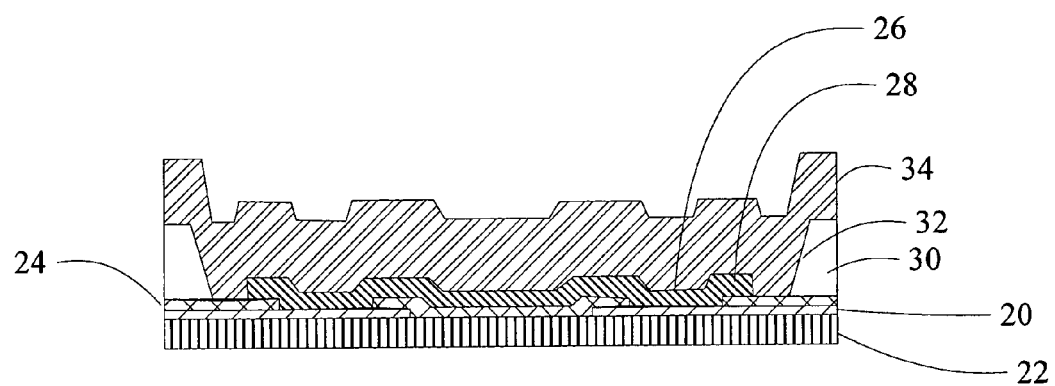
FIG. 2a is a side section view of the layers of the array prior to etching.

As shown in FIG. 2a, the first trace and pad features are deposited in a first metal layer 20 on a glass substrate 22. Etching processes to define the trace and pad contours have been performed and a first dielectric layer of a-Si 24 deposited over the first metal. Etching of the a-Si layer provides first vias 26 through the a-Si layer. A second metal layer 28 is deposited for the TFT source and drain electrodes in the embodiment of the array shown. This second metal layer contacts the first metal layer through the first vias providing shorting contact between the first and second traces as well as the a-Si elements during further handling and processing for ESD protection.

A second dielectric $SiO_2$ multilayer 30 is deposited and a second via 32 is created surrounding the shorting bar during normal processing for connection of a third metal layer 34 to the second metal layer. For the embodiment shown, this second via is approximately 20 μm×40 μm. The third metal layer, which for the embodiment shown is for data lines in the array, is then deposited. Using known photoresist masking techniques, the shorting bar is masked for etching and, after deposition of the third metal layer, the photoresist around the shorting bar is removed. During wet etching of the third metal layer, the top metal layer is etched away first, and then the shorting bar is removed by the same process. In the region of the second via, both the second and third metal layers are etched away. The shorting bar is sized with a relative width narrow enough to allow the same etching recipe to perform the etching. For the embodiment shown, the shorting bar width is only 5 μm, whereby side etching occurs faster than top etching and the shorting bar is eliminated in its entirety during the etch. The total etching time in the process step is the same as if no shorting bar was present.

In the embodiment shown, the second metal layer is thicker than the first metal layer resulting in poorer step coverage. The second metal constituting the shorting bar is surrounded by the second via therefore any tunneling etching along the poor step coverage of the second metal is confined by the second via. The area of the second via is shown in section view in FIG. 2b after the wet etch showing the removal of the shorting bar.

Figure 2B:
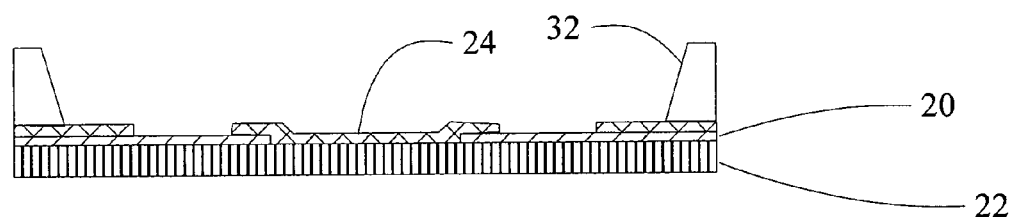
FIG. 2b is a side section view of the layers of the array after etching.

The first embodiment disclosed with respect to FIGS. 1, 2a and 2b relies on a metal layer as the shorting bar which is removed in one etching step near the end of the array processing. A second embodiment which relies on multiple shorting elements in different layers is disclosed in FIGS. 3a–c and 4. This embodiment provides a first shorting element in a thin metal layer employed in the process and an amorphous silicon phosphor doped layer with the intrinsic layer as a second shorting element.

Figure 3A:
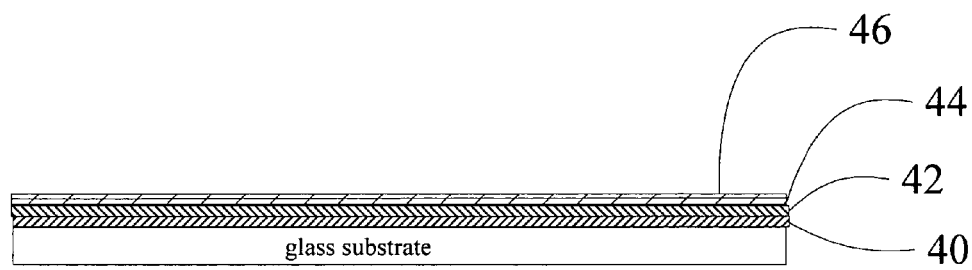
FIG. 3a is a side section view of the layers of an array employing an alternative embodiment of the invention before the second metal deposition step.
Figure 3B:
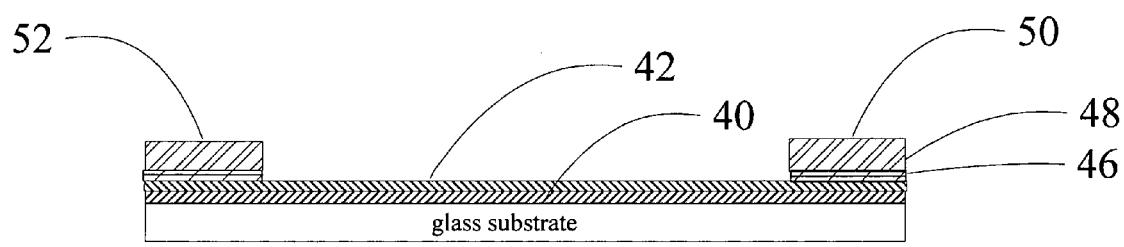
FIG. 3b is a side section view of the layers of the array of FIG. 3a after the second metal deposition step and after the second metal etching.
Figure 3C:
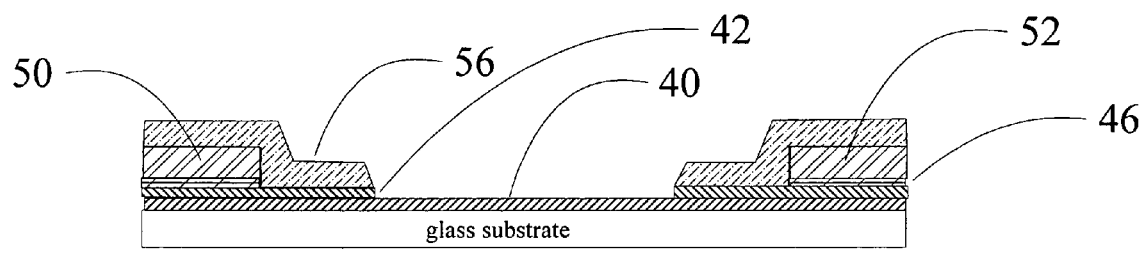
FIG. 3c is a side section view of the layers of the array after deposition of amorphous silicon nitride and diode etching; and, FIG. 4 is a top view of the array of FIGS. 3a–c showing the etched portion of the shorting bar of the present invention after diode etching.
Figure 4:
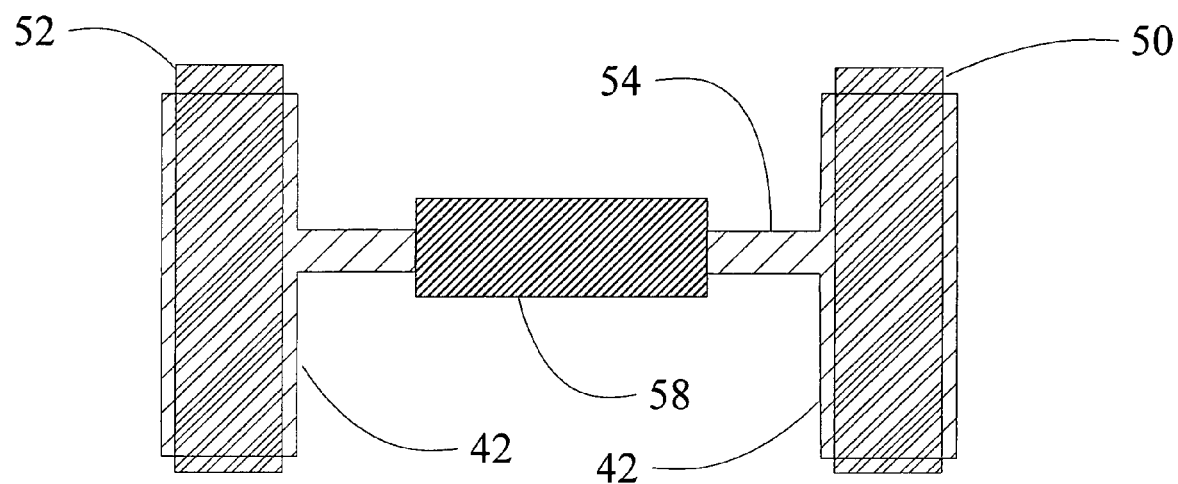

As represented in FIG. 3a, a TFT deposition process first generates continuously three layers inside PECVD chamber, an amorphous Silicon Nitride (a-SiN) layer 40, an undoped a-Si:H layer 42 and a phosphorus doped a-Si:H layer 44 which are jointly referred to as FET silicon. The n+ a-Si:H is then capped by a thin metal layer 46 of molybdenum in the embodiment shown. At this time, metal traces are shorted with shorting bar traces deposited in this metal cap for ESD protection. For the embodiment shown, a second metal layer 48, which for the present embodiment is the same material as the thin metal cap layer, is deposited for the traces in the array. After metal etching as shown in FIG. 3b, the metal shorting bars are removed since the thin metal cap layer is etched with the second metal layer leaving metal traces 50 and 52. All metal traces, 50 and 52 as exemplary, are still connected through undoped FET silicon bars 54 (as best seen in FIG. 4) that continuously provides a leakage current path for static charges.

The following process is deposition of an a-SiN passivation layer 56 on the TFT panel and opening vias at each pixel in the array for photodiode bottom contact. A via 58 is also put right above the FET silicon shorting bar. During etching of about 1 μm of a-Si:H for diode, the thin FET silicon is also removed, which then completely isolates all traces as shown in FIG. 4 as a top view of the array elements shown in section in FIGS. 3a–c.

For both the embodiments described, the partially completed photodiode array panels comprise a process intermediate which provides ESD protection for the panels during handling and further processing. The first embodiment provides a metal shorting bar which remains a part of the process intermediate until the etching of the third metal layer is accomplished. The second embodiment provides ESD protection through two paths, a first set of metal shorting bar traces and leakage path through undoped FET silicon, each of which is removed at predetermined process steps.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A method for providing electrostatic discharge protection during fabrication processing of photodiode array panels comprising the steps of:

depositing first trace and pad features in a first metal layer on a glass substrate;

etching to define the trace and pad contours;

depositing a first dielectric layer over the first metal layer;

etching the first dielectric layer to provides first vias through the dielectric layer;

depositing a second metal layer contacting the first metal layer through the first vias providing a shorting bar for contact between the traces during further handling and processing for ESD protection;

depositing a second dielectric layer;

creating a second via surrounding the shorting bar during normal processing for connection of a third metal layer to the second metal layer;

depositing the third metal layer;

masking the third metal for etching;

removing the photoresist around the shorting bar; and, etching the third metal layer and the shorting bar.

2. A method as defined in claim 1 wherein the second via is about 20 μm×40 μm.

3. A method as defined in claim 1 wherein the shorting bar is sized with a relative width narrow enough to allow the same etching recipe for removal of the third metal layer to perform the etching of the shorting bar.

4. A method as defined in claim 3 wherein the shorting bar width is defined so side etching occurs faster than top etching and the shorting bar is eliminated in its entirety during the etch.

5. A method as defined in claim 4 wherein the shorting bar width is about 5 μm.

6. A method as defined in claim 1 wherein the first dielectric layer is a-Si.

7. A method as defined in claim 1 wherein the second dielectric layer is a SiO2 multilayer.

* * * * *